United States Patent [19]

Drake et al.

[11] Patent Number: 4,894,612

[45] Date of Patent: Jan. 16, 1990

[54] SOFT PROBE FOR PROVIDING HIGH SPEED ON-WAFER CONNECTIONS TO A CIRCUIT

[75] Inventors: Robert E. Drake, Somers; Sadeg M. Faris, Pleasantville; Roy M. Patt, Walden; Zhi-Yuan Shen, Ossining, all of N.Y.

[73] Assignee: Hypres, Incorporated, Elmsford, N.Y.

[21] Appl. No.: 249,101

[22] Filed: Sep. 23, 1988

Related U.S. Application Data

[63] Continuation-in-part of Ser. No. 84,953, Aug. 13, 1987, abandoned.

[51] Int. Cl.$^4$ ................................................ G01R 1/06
[52] U.S. Cl. .............................. 324/158 P; 324/72.5; 324/158 F
[58] Field of Search ........... 324/158 P, 158 F, 73 PC, 324/72.5

[56] References Cited

U.S. PATENT DOCUMENTS

| | | | |
|---|---|---|---|
| 3,596,228 | 7/1971 | Reed, Jr. ....................... | 324/158 P |
| 4,422,088 | 12/1983 | Gfeller ............................ | 357/19 |
| 4,593,243 | 6/1986 | Lao et al. ....................... | 324/158 P |
| 4,697,143 | 9/1987 | Lockwood et al. ............. | 324/158 P |
| 4,749,942 | 6/1988 | Sang et al. ...................... | 324/158 P |

*Primary Examiner*—Ernest F. Karlsen
*Attorney, Agent, or Firm*—Kenyon & Kenyon

[57] ABSTRACT

Miniature soft probes are used to provide a high speed connection to circuits on a wafer. The probe contains a co-planar line on a soft substrate which provides a flexibility for secure contacts. A miniature coaxial line is directly connected to the coplanar line with a zero degree angle. This configuration makes the probe very small and result in high performance. A planar link between two ground planes eliminates any unwanted odd mode. The probes have high speed and wideband transmission lines with interfaces which have speed in the picoseconds and bandwidths in the hundreds of gigahertz. The probes have multi-functional capabilities, such as high impedance buffering and DC blocking, due to printed circuits which constitute a portion of the probe. The printed circuits are produced by a thin film photolithic process. These probes are best suited for on-wafer tests, diagnostics and measurements as well as interfacing on-wafer circuits with other electronic or electro-optical systems.

7 Claims, 10 Drawing Sheets

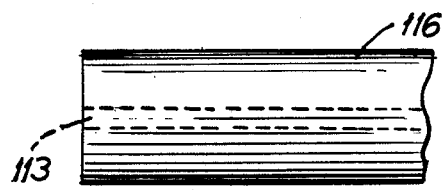
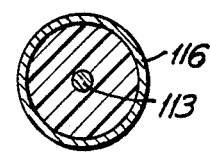
FIG.11(a)-I  FIG.11(a)-II
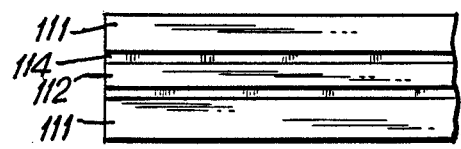
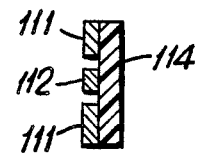
FIG.11(b)-I  FIG.11(b)-II
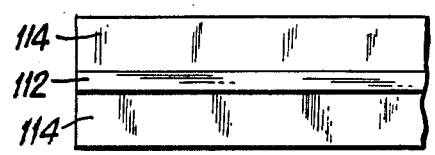
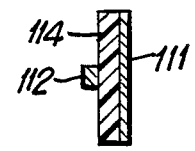
FIG.11(c)-I  FIG.11(c)-II
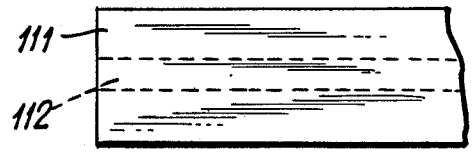
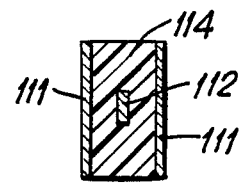
FIG.11(d)-I  FIG.11(d)-II
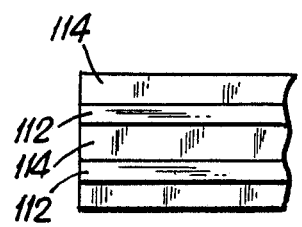 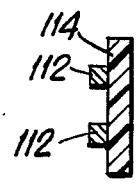 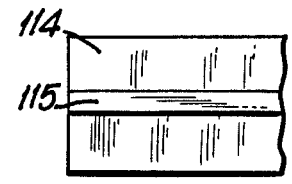 
FIG.11(e)-I  FIG.11(e)-II  FIG.11(f)-I  FIG.11(f)-II

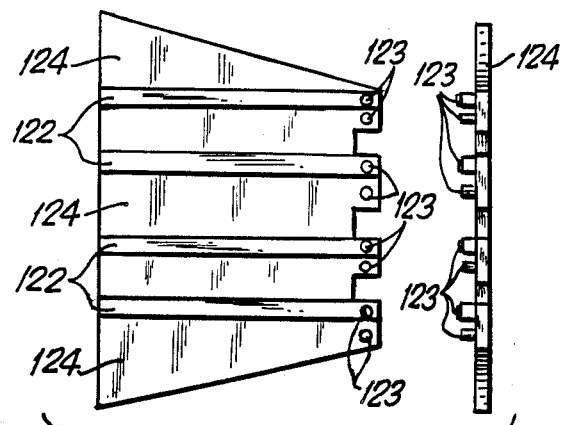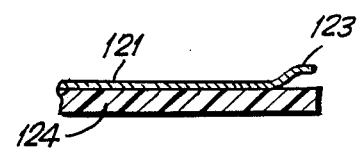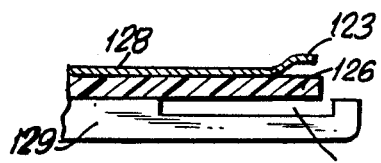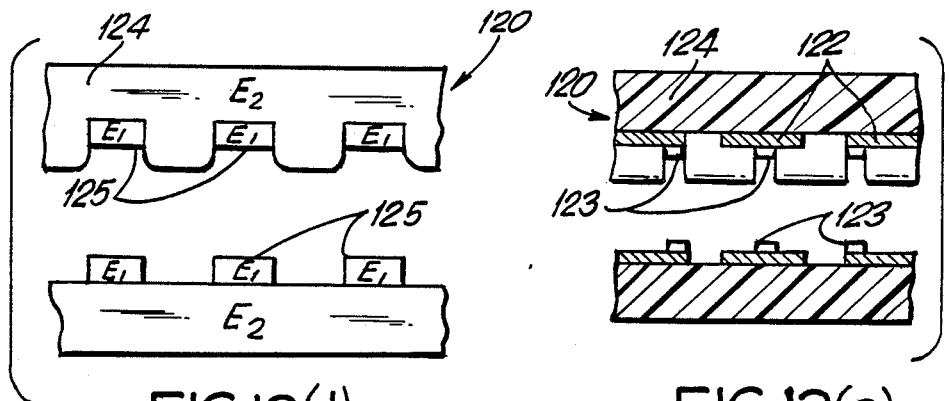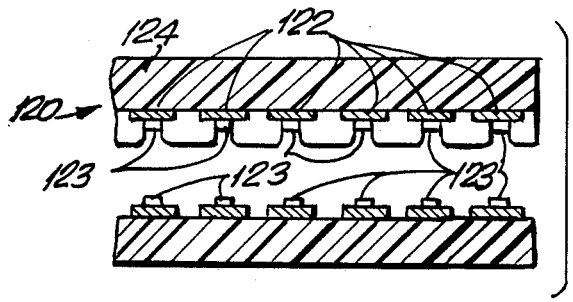

SOFT PROBE FOR PROVIDING HIGH SPEED ON-WAFER CONNECTIONS TO A CIRCUIT

CROSS REFERENCE TO OTHER APPLICATIONS

The present application is a continuation in part under 35 U.S.C. § 120 of U.S. application Ser. No. 084,953 filed on Aug. 13, 1987, now abandoned.

BACKGROUND OF THE INVENTION

1. Technical Field

The present invention relates to a probe for providing a high speed connection, on the order of picoseconds, to a circuit or circuits on a wafer. In particular, the unique configuration of the probe allows for connection of the circuit on the wafer to other electrical systems including test equipment. The present invention provides a probe which permits picosecond speed/wideband measurements and diagnostics of the circuit on the wafer.

2. DESCRIPTION OF THE RELATED ART

At present, circuitry can be produced on wafers or chips by known methods. It is desirable to test the individual circuits on the wafer prior to packaging. Test equipment is known which is capable of operating at a speed in the picosecond range for carrying out tests on the individual circuits. It is necessary, however, to provide a connection from the test equipment to the circuits on the wafer or chip.

A means for providing a connection between test equipment and a circuit on a chip which is already cut from a wafer is disclosed in U.S. Pat. No. 3,596,228 to Reed, Jr. The patent discloses a fluid actuated contactor which provides multiple contacts between the circuit on chip and microstrip lines disposed on a flexible dielectric membrane. However, the microstrip lines on the membrane restrict the operating frequency band. Furthermore, the cumbersome structure makes it only suitable for making contacts to the circuit on a chip which is already cut from the wafer. It is not suitable for making contacts to circuits on the wafer, where the circuit density is very high.

U.S. Pat. No. 4,697,143 to Lockwood et al. discloses a wafer probe which is able to provide connections to circuits on wafer. However, this probe has the following disadvantages:

1. Lockwood's probe uses a thin ceramic for a substrate. The ceramic is easily broken and difficult to replace.

2. A large coaxial connection is used to be in direct contact with a transmission line on the probe. There is a 90° bend at the interface of the coaxial cable and the transmission line. The sharp bend causes radiation, reflection and moding. Moreover, the configuration requires a probe of a large size which further degrades the RF (Radio Frequency) performance of the probe.

3. The large-size probe must be reduced to a small-size tip which contains small contacts. In order to make the reduction smooth and gradual, the length of the probe must be increased to about one inch. The long transmission line on the probe suffers excessive attenuation, dispersion, and parasitic coupling to the circuit under test. In a multi-channel configuration, cross talk between channels may also arise because of the long parallel transmission lines on the probe.

4. In order to avoid unwanted parasitic coupling between the probe and the circuit under test, as well as to avoid the cross-talk between different channels on the probe, absorbing materials and shielding are needed to make the probe into a multi-layer structure. In fact, the structure of the probe of U.S. Pat. No. 4,697,143 has seven layers. The complex structure makes the probe both costly and difficult to fabricate.

5. As a result of the above facts, the bandwidth and the speed of the probe are limited.

At present, a probe for on-wafer measurements is manufactured by Cascade and described in a brochure entitled "26.5 GHz Microwave Wafer Probing" by Cascad Microtech, Inc. Beaverton, Oregon. However, the probe has a maximum operational speed of 20 picoseconds. In addition there are other limitations to the operation of the probe which arise from the design of the probe. The design causes high reflection, radiation and high modes excitation especially at high speed or high frequency. This degrades the performance of any testing of the on-wafer circuit. In addition, the probe design results in the introduction of high insertion loss and cross talk while operating at high speeds and high frequencies. The construction of a substrate which is utilized to support the material which forms a conduit path in the probe suffers from a large discontinuity at the interface with the circuit on the wafer with which it connects. This is one of the causes of the reflection, radiation and high modes excitation which degrade the performance of the test circuitry at high speed and high frequency.

More specifically the limitations of the probe are set forth as follows.

The Cascade probe utilizes a coaxial to co-planar 90° bend transition which causes high reflection, radiation and high modes excitation, especially at high speed/high frequency which thus degrades the performance of the system.

The Cascade probe utilizes a material having a high dielectric constant (such as alumina, $E_r=9$) as the substrate for a co-planar line. This material causes a confinement of RF fields in the substrate. At the interface with the circuit on the chip the highly asymmetrical RF field distribution encounters a large discontinuity which causes reflection, radiation and high modes excitation resulting in a degradation of the high-speed/high frequency performance capabilities.

In order to obtain some mechanical flexibility, the alumina substrate utilized in the Cascade probe must be long (several centimeters). The long co-planar line disposed on the substrate suffers high dispersion, high insertion loss and cross talk, especially at high speed and high frequency. Therefore, further performance degradation is expected.

The contact tip of the Cascade probe is made of a very thin alumina chip which is fragile and can be easily broken during the testing process.

The Cascade probe's lack of sophistication prohibits it from using built-in printed circuit elements such as DC block/AC coupler, filter, mixer, electro-optical converter, and other electrical or optical networks for more complex tests.

The alumina utilized in the Cascade probe does not have the flexibility required for multi-channel independent contacts.

The end result is that the available probe limits the operational speed of the electrical circuitry, such as test equipment, which is to be connected to the on-chip circuit. The performance of the circuitry may also suffer degradation at high speeds and high frequencies.

Finally, the known probe does not provide the sophistication and flexibility necessary for wide ranges of use.

As the operating frequency of semiconductor devices approaches higher and higher frequencies, a new probe with much better performance is needed to do on-wafer testing. The probe should achieve the following:

1. Flexibility: The probe should provide easy, secure and repeatable contact to the circuit under test.

2. Broadband and high performance: The probe should provide low insertion loss, low dispersion, low reflection, low radiation, and low cross-talk in a broadband up to 100 gigahertz.

3. simple and cost effective: The structure of the probe should be as simple as possible to make it easy to fabricate and the structure should be cost effective.

4. Small disturbances: For end-contact probes it is necessary to match the impedance of the circuit under test. Normally this requires 50 ohm impedance. When the probe is to be used for intermediate contact, a high impedance is required. It is necessary that all high speed/wideband probes have small parasitics.

5. High information flow: The probe should have the ability to operate in picoseconds in the time domain and must also have the capability of operating with a bandwidth of up to hundreds of gigahertz in the frequency domain.

6. versatility: The probe should be adaptable, that is it must be able to interface with different types of transmission lines having different dimensions.

7. Easy to use: The probe should easily make good contact with the circuit under test and it must easily interface with test instruments or other electronic, or electro-optical systems.

8. Rigidity and Durability: The probe should be rigid and should have the durability to make contacts thousands of times without performance degradation and with minimal physical decay.

9. Multi-channel test abilities: The probe should have the capability of testing complicated circuits. Therefore dual-channel and multi-channel configurations are required for providing input, output, DC supply and ground return signals among other signals.

10. On probe printed circuit: In order to test more sophisticated circuits a probe should include printed circuits such as DC block/AC coupler, filters, mixers, electro-optical converters, and other passive or active networks in order to enhance the operational capabilities of the device.

SUMMARY OF THE INVENTION

It is an object of the present invention to provide a probe for providing a connection to a circuit on a wafer. The probe is of a construction which does not unduly limit the operational speed of an electrical system which includes the probe and the circuit on the wafer.

It is a further object of the present invention to provide a novel probe construction which has a greatly simplified structure and permits improved operating capabilities at high speeds, high frequencies of operation and improved frequency bandwidth. In addition, independent flexible contacts are provided for making reliable and secure connections with circuits under test.

It is a further object of the present invention to provide a probe made of a printed circuit deposed on a soft flexible substrate for making a reliable and secure connection with circuits under test.

It is another object of the present invention to provide a probe having built-in, sophisticated, integrated circuitry so as to expand the potential uses of the probe.

The above and further objects of the present invention are achieved by a probe for providing a connection to a circuit on a wafer which may include a flexible substrate; and means for transmitting a signal to the on-wafer circuit, said means for transmitting including transmission lines being disposed on said flexible substrate so as to be substantially co-planar with the on-wafer circuit when in contact with the on-wafer circuit.

Alternatively the probe may include a broadband coaxial connection; a miniature printed circuit on a soft substrate to provide the means for transmitting a signal to the on-wafer circuit under test; and a miniature coaxial line between the said connector and the said miniature printed circuit on a soft substrate.

The probe may comprise a transmission line or transmission lines which have a ground plane and a strip line wherein the ground plane and the strip line are separated by a predetermined distance so as to maintain a prescribed impedance for the means for transmitting.

The probe may further comprise an integrated circuit connected to the transmission line. The integrated circuit may comprise an electro-optical converter which is connected to the transmission line. The means for transmitting may further comprise an optical waveguide which is connected to the electro-optical converter. The integrated circuit may also include a high impedance buffer or a dc block.

The probe may further comprise contacts which are disposed on the strip line and contact or contacts disposed on the ground plane. These contacts are flexible, durable, and may include a self-alignment mechanism for making easy, secure connections.

The substrate of the probe may comprise natural or synthetic material which has good mechanical flexibility while maintaining good dielectric characteristics.

The probe may further comprise a novel mechanism to suppress the unwanted odd modes. The suppression mechanism may be a metallic link between two ground planes at the tip of the probe. This mechanism makes the probe simple and free of moding.

BRIEF DESCRIPTION OF THE DRAWINGS

The present invention will be described in greater detail below in the following description, with reference being made to the drawings in which:

FIG. 4 illustrates the contacts in details.

FIG. 5(a) illustrates an "A" view of the connections of elements in an embodiment of a probe of the present invention while

FIGS. 11(a)I to 11(f)I and 11(a)II to 11(f) II illustrate a plurality of transmission line configurations which might be utilized in an embodiment of a probe of the present invention;

FIGS. 12(a) to 12(f) illustrate exemplary configurations for independent flexible contacts for embodiments of the probe of the present invention;

DETAILED DESCRIPTION

Figure 1:
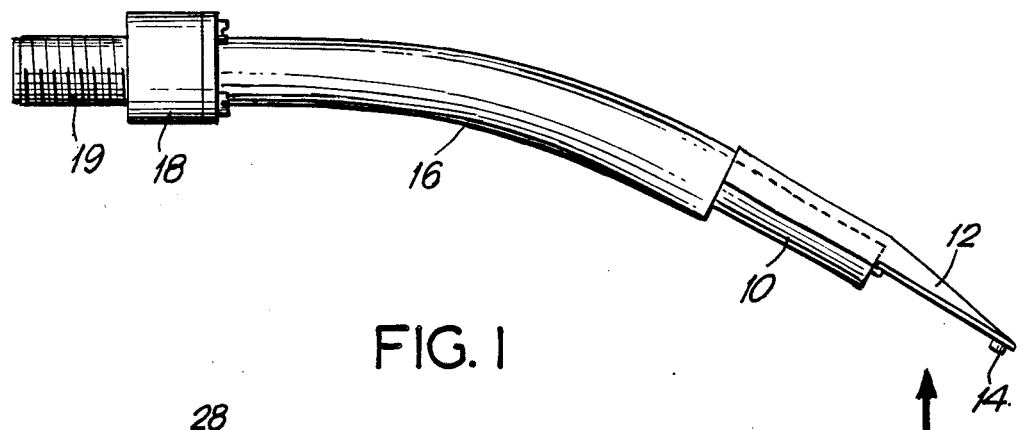
FIG. 1 is a side view of an embodiment of a probe of the present invention.
Figure 2A:
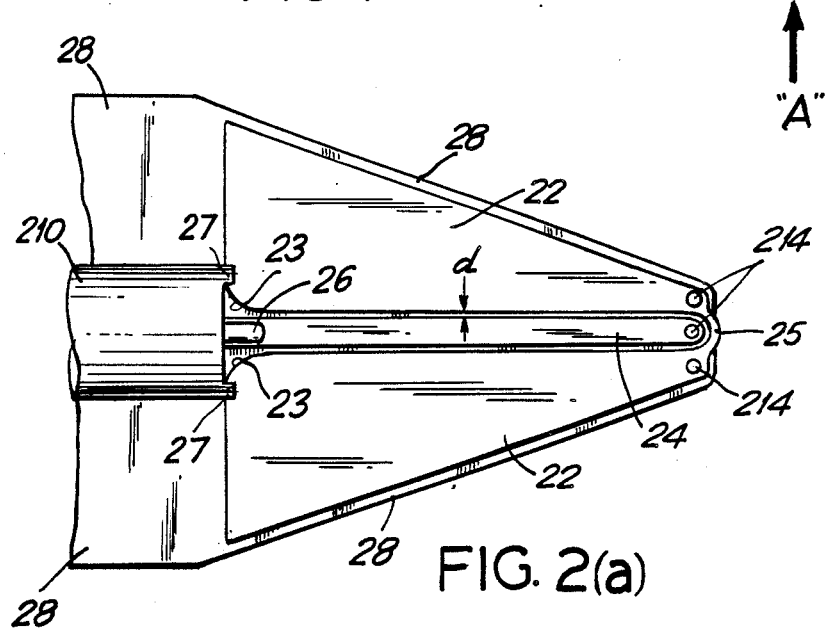
FIGS. 2(a) and 2(b) are views of alternate embodiments for a tip of a probe of the present invention from direction "A" of FIG. 1.
Figure 2B:
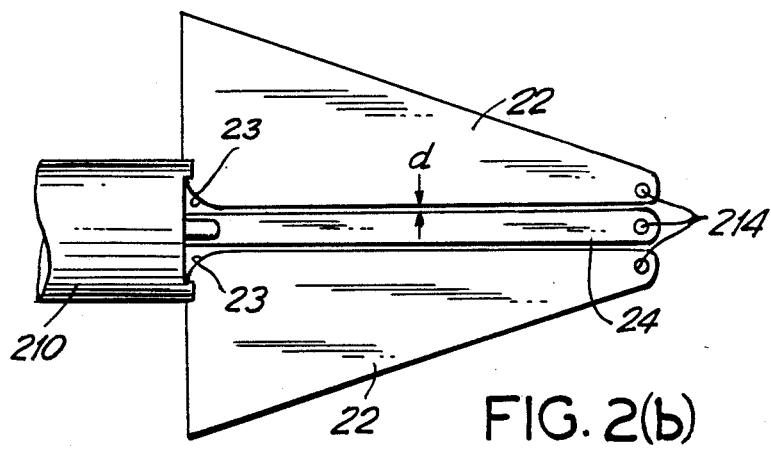

FIGS. 1, 2(a) and 2(b) illustrate a first embodiment of a probe of the present invention. In FIG. 1 a sideview of the probe is presented, while FIGS. 2(a) and 2(b) illustrates a bottom view (represented as "A" in FIG. 1) of an end of the probe of FIG. 1. The end of the probe connects to a circuit on a wafer.

Taking these figures together, the first embodiment will be described. In FIG. 1, a contact 14 provides a physical connection to a circuit on a wafer. Contact 14 of FIG. 1, corresponds to the three contacts 214 of FIG. 2. The contacts are disposed on a co-planar line which consists of ground planes 22 and strip line 24. The coplanar line is operating in an "even" mode with low dispersion with a contact on each ground plane 22. However, the unwanted "odd" mode can be excited especially when the probe is connected to a circuit with a contact on only one ground plane 22. In order to suppress the odd mode, a metallic link 25 located at the tip of the probe connects two ground planes 22 electrically. This mechanism not only effectively suppresses the odd mode, but also eliminates the need for more complicated mode suppression devices. Therefore, it simplifies the structure of the probe. The ground planes, the link between them and the strip line are disposed on a flexible substrate 12 (28 in FIG. 2(a)). The substrate is made of a soft dielectric material having a low dielectric constant, low loss, good surface quality that is suitable for a photolithographic thin film process and good mechanical flexibility. The dielectric constant should be in the range of 2 to 5 where 1 is the dielectric constant of air. Loss is defined as a ratio of energy lost in the material to energy stored in the material. A low loss would be on the order of $10^{-3}$ to $10^{-4}$. Possible materials for this substrate include, but are not limited to, teflon, teflon filled with fiberglass, vessel, fused quartz and silicon dioxide.

It is important that the substrate have mechanical flexibility so as to achieve a soft and secure contact with the circuit on the chip. The mechanical flexibility is very important for the present invention. It provides the reliability and durability of the contact for the probe to the circuit on wafer which can be achieved by a very short probe. Otherwise, if a stiff material, such as a ceramic, is used as the substrate, it is not only easily broken, but also requires a much longer length for the probe. As a result, it suffers dispersion, high loss, and cross talk via parasitic coupling. Then, to solve these problems, a lot of accessories, such as shielding, absorbing material, etc., have to be added to the long probe, making it even more cumbersome. Therefore, the flexible substrate material is one of the key aspects of the present invention which achieves a high performance probe. The co-planar line can be disposed on the substrate by a known photolithographic thin film process.

The coplanar line is connected to a miniature coaxial cable 10 of FIG. 1 (210 of FIG. 2(a) and 2(b)) with an angle close to 0°. The other end of the cable is connected to the broadband coaxial connector 19 via broadband transmission connector 18 for coupling miniature coaxial cable 10 and broadband coaxial connector 19. A sleeve 16 may be used to support the miniature coaxial cable. This arrangement is quite different from other probes such as the one disclosed in U.S. Pat. No. 4,697,143, in which the coaxial connector is directly connected to the transmission line printed on a substrate, with 90° angle. The unique configuration of the angular relationship between the coplanar line and the miniature coaxial cable in the probe of the present invention is another element for the success of the present invention.

The following are among the differences which set the probe of the present invention apart from other probes:

(1) As mentioned previously in the Background section, the 90° angle interface of the coaxial connector to the transmission line on the substrate causes many problems: moding, radiation loss, and the requirement for a transmission line that is too large being disposed on the substrate. All of this causes performance degradation. The embodiment of the present invention shown in FIG. 1 eliminates the 90° angle interface. Therefore, it is free from all the problems of the probes which have such an interface.

(2) Since the miniature coaxial cable 10 in FIG. 1 (210 in FIG. 2) matches the dimensions of the transmission line on the substrate, and the substrate has enough flexibility for making secure contact to the circuit on wafer, the length, as well as the width, of the substrate can be miniaturized. This contributes to low dispersion, low loss, and low cross-talk. In other words, high performance is achieved.

(3) Since radiation is avoided, cross-talk is minimized, odd modes are suppressed and there is no need for cumbersome accessories such as shielding, absorbing, metal channel, etc. so that simplicity, ease of manufacture, and lower cost are achieved.

(4) The miniaturization of the probe makes it easier to approach a circuit on wafer and to make contact with the circuit as opposed to the cumbersome contact made by other probes. This is especially true when several probes make contact to the same circuit on a wafer where space is limited.

Also the orientation of the probe is such that when it makes contact with a circuit on-wafer, the co-planar line is substantially co-planar to the on-wafer circuit. This arrangement dramatically reduces any delay that might be introduced by the probe.

The configuration illustrated in FIG. 2(a) is a single channel, symmetrical co-planar line, that is, there is one strip line 24 for the single channel and two ground planes 22, one disposed on either side of the strip line 24. The ground planes 22 and the strip line 24 have a total of three contacts 214, which makes the configuration symmetrical. There is a predetermined gap distance d between the strip line 24 and each of the ground planes 22 (only shown for one of the gaps) so as to maintain a prescribed impedance of the probe. The typical impedance of the probe should be 50 ohms even though other values are possible.

FIG. 2(a) shows the interface between the miniature coaxial cable 210 and the coplanar line on the substrate. The inner conductor 26 is soldered to the strip line 24. The diameter of inner conductor 26 is chosen to be close to the width of the strip line 24 in order to minimize the discontinuity. However, the diameter of the outer conductor 27 is larger than the distance between the two ground planes 22 of the coplanar line at the interface. The rounded corner transitions 23 of the two ground planes 22 are used to provide a gradual change for minimizing the discontinuity. This arrangement, along with the almost zero degree angle between the axis of the coaxial cable 210 and the surface of the substrate, makes the interface a high performance interface. In addition, since the coplanar line is miniaturized at its input, the transverse dimensions are not so different from those at the tip. Hence, the transition of the coplanar line will be minor. This, along with the flexibility of the substrate, helps to reduce the length of the line, thereby resulting in better performance as compared to other on-wafer probes.

In FIG. 2(a) it is also seen that there is a small angle in the ground planes at the connection of the co-planar line to the cable 210. This gradual change or transition area at each connection 23 is provided so as to minimize the discontinuity that may arise at the connection point. In addition, it can be seen that the co-planar line itself has a gradual transition from its connection to the cable 210 to its tip at which the contact points 214 are located. This configuration also minimizes the discontinuity and it reduces the likelihood of reflection.

The characteristics prescribed for the substrate, namely its good mechanical flexibility and low dielectric constant, permit the use of a substrate of small length. Typically, a length of one to two millimeters is sufficient. Therefore, the length of the co-planar line disposed on the substrate is also reduced. This improves the insertion loss and the cross talk of the probe dramatically. The shorter the co-planar line the lower the loss and the lower the crosstalk.

At the very tip of the probe, there is a metallic link 25 (of FIG. 2(a)) connected to the two ground planes 22. It serves as a short-circuit between the two ground planes to prevent excitation of the unwanted odd mode in the coplanar line. This is especially important when the probe is connected to a transmission line via only two contacts (one on the center strip 24, the other on one of the ground planes 22). In this case, the odd mode is very easily excited and can cause performance degradation. In order to maintain the short-circuit effective through out the entire frequency band, the self-inductance of the link 25 must be minimized. This means that as short a path as possible between the two ground planes 22 should be chosen. On the other hand, the link 25 should not be too close to the tip of center strip 24. Otherwise, the capacitive coupling between them will degrade the performance as well. Therefore, some trade off must be expected. Experiments indicate that the gap distance between the link 25 and the tip of the center strip 24 should be approximately double the gap distance d between the center strip 24 and each of the ground planes 22.

At the very tip of the probe, the contact points 216 of FIGS. 2(a) and 2(b) sit on top of the co-planar line, which as described above may be composed of a thin film disposed upon the substrate using a known photolithographic thin film process. This configuration makes contact with the circuit on the chip very easily and it makes a secure contact. The shape, size and the location of the contact points are carefully designed to avoid harmful parasitics, such as step capacitance and lead inductance.

In order to hold together the co-planar line, (ground planes 22 and strip line 24) of FIGS. 2(a) and (b) and the cable 210, a throughhole is drilled in the substrate 12 to hold the semi-rigid miniaturized coaxial cable 10 and to align it with the co-planar line. The cable is aligned with the co-planar line at a small angle, approaching zero degrees, so as to eliminate the discontinuity at the interface between the cable 210 and the co-planar line produced by ground planes 22 and strip line 24.

Another embodiment of a probe in accordance with the present invention is illustrated in FIG. 2(b). The probe is identical to that of FIG., 2(a) except that there is no metallic link 25 connecting the two ground planes. Where there is concern about an odd mode this link should be provided. The substrate 28, although not shown in FIG. 2(b), is also an element of this probe.

FIGS. 3(a) to 3(e) illustrate different embodiments for probe ends for a probe of the present invention using either two or three contacts 214 of FIGS. 2(a) and 2(b).

Figure 3A:
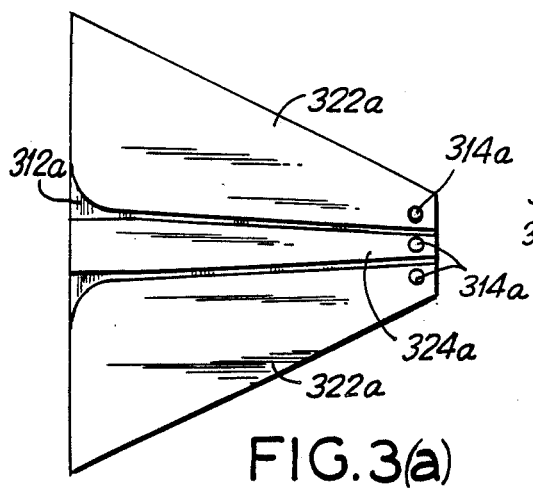
FIG. 3(a) illustrates an "A" view of an embodiment of a symmetrical probe of the present invention having three contacts.

FIG. 3(a) illustrates a symmetrical co-planar line including ground planes 322a and strip line 324a, disposed on substrate 312a, with contact points 314a on the ground planes 322 and strip line 324. The contact points are oval in shape and are disposed upon the co-planar line.

Figure 3B:
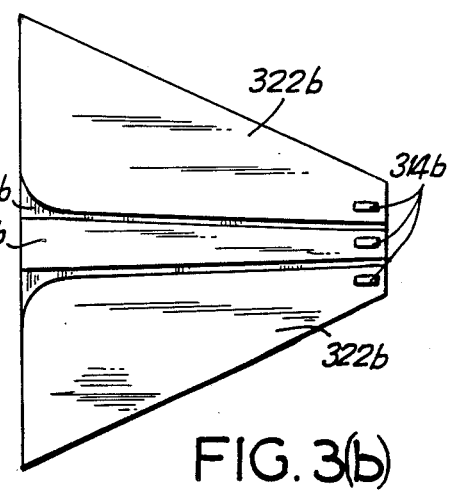
FIG. 3(b) illustrates an "A" view of another embodiment of the present invention having three contacts.

FIG. 3(b) illustrates a symmetrical co-planar line consisting of ground planes 322b and strip line 324b disposed on substrate 312b, having contact points 314b which are small rectangular strips.

It should be noted that the shape of the transition from the contact point end of the probe to the far end of the co-planar line is not restricted to a specific shape but rather must be sufficient to provide a gradual change to adapt the probe to the circuit configuration on the wafer as well as to avoid reflections that may result from rapid changes and discontinuities. Regardless of the shape of the transition area on the co-planar line, if it is desired to maintain a specific impedance for the probe, e.g. 50 ohms, then the gap distance d between the strip line and the ground planes must be carefully maintained.

Figure 3C:
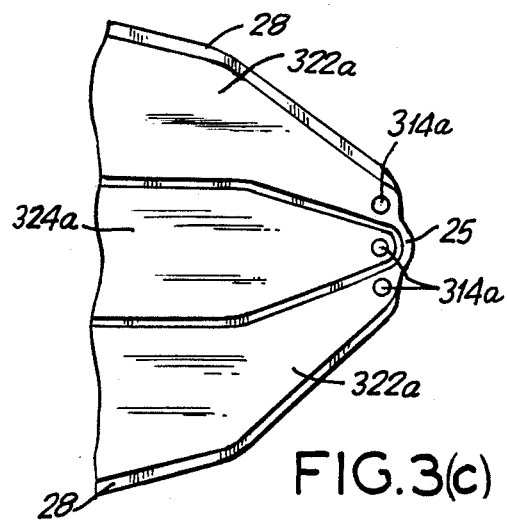
FIG. 3(c) illustrates an "A" view of yet another embodiment of the present invention having three contacts.

FIG. 3(c) illustrates a symmetric probe with three contacts. This probe is similar to the probe of FIG. 3(a) except that it further includes metallic link 25. Naturally the probe of FIG. 3(b) can also be modified to include such a metallic link.

Figure 3E:
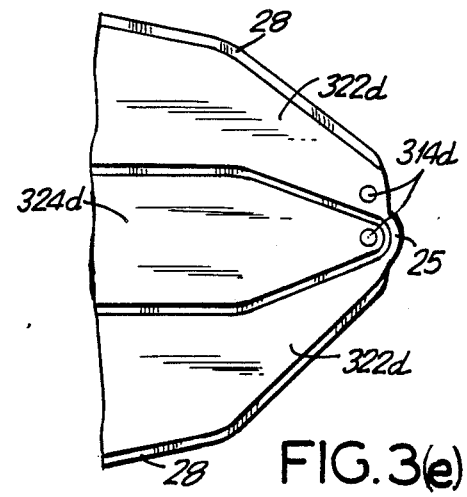
FIG. 3(e) illustrates an "A" view of a still further embodiment of the probe of the present invention having two contacts.
Figure 3D:
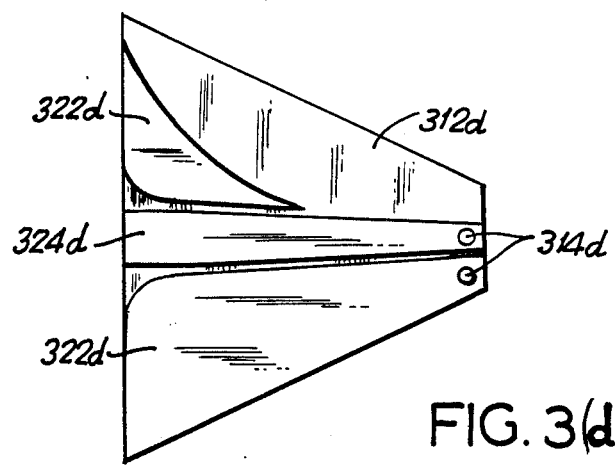
FIG. 3(d) illustrates an "A" view of a further embodiment of the probe of the present invention having two contacts.

FIG. 3(d) illustrates an asymmetric probe. In this embodiment there are two ground planes 322d and a strip line 324d disposed on substrate 312d. However, thee are only two contact points 314d, one provided on the strip line 324d and one provided on one of the ground planes 322d. The top ground plane 322d region is of a smaller configuration than that of the bottom region to which the contact point 314d is attached. This is an asymmetric probe as it provides only one ground plane contact and one strip line contact. It is also possible to produce such an asymmetric probe by utilizing only one ground plane and one strip line, i.e., the upper ground plane 322d would not appear in an alternative version of the asymmetric probe. There would merely be uncovered substrate 312d in this upper region. In yet another possible asymmetric probe configuration, the entire upper portion would contain ground plane 322d which would be of the same size and configuration as the bottom ground plane 322d however the upper ground plane would have no contact 314d attached to it. Optimally, the elimination of one ground plane should be arranged in such a way that the change of the configuration should be gradual and the gap between the strip 324d and the ground plane 322d should be changed accordingly in order to maintain the correct impedance as required. It has been discovered that the most advantageous asymmetric probe without metallic links is the probe having a configuration in which part of the upper ground plane 322d has been shaved away as illustrated in FIG. 3(d).

FIG. 3(e) illustrates another asymmetric probe whereby only one ground plane contact is provided in addition to the contact for the strip line. This probe differs from that of FIG. 3(d) in the shape of the contactless ground plane and the presence of a metallic link connecting the two ground planes. These modifications provide a more advantageous embodiment than those discussed above in connection with FIG. 3(d).

Figure 4A:
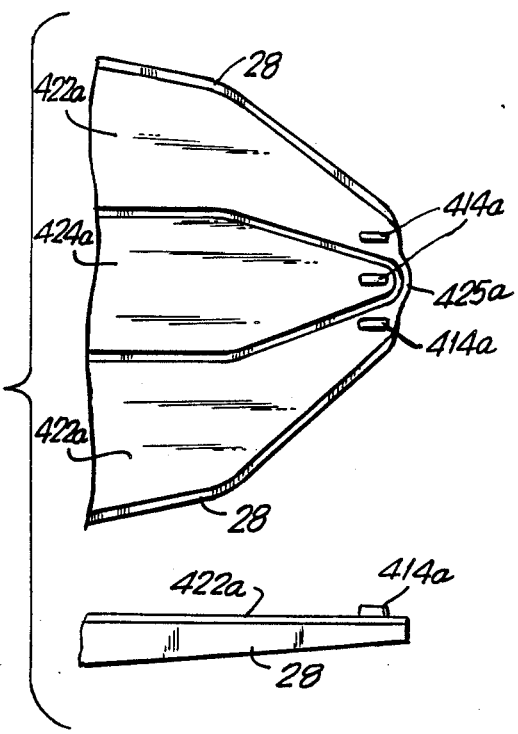
FIG. 4(a) illustrates contacts made by a printed circuit technique.

The number of contacts per channel, as illustrated in FIGS. 3(a) to 3(e), depend upon the interface configuration of the circuit under test. There are several ways to make these contacts as shown in FIG. 4: (a) one way is using a known photolithographic process to dispose metal as contacts; (b) the second way is using tiny metallic balls soldered on the tip of the coplanar line as contacts. In either case, the height of the contacts should be sufficient to prevent the metallic link 25 of FIG. 2(a) from touching the circuit under test. In FIG. 4(a) ground planes 422a and strip line 424b each have contacts 414a which are produced from rectangular strips of contact material which may be of the same material as the co-planar line, but may, however, consist of an additional layer of different material raised above the surface of the co-planar line. These elements are disposed on substrate 28. The ground planes 422a are connected by metallic link 425a.

Figure 4B:
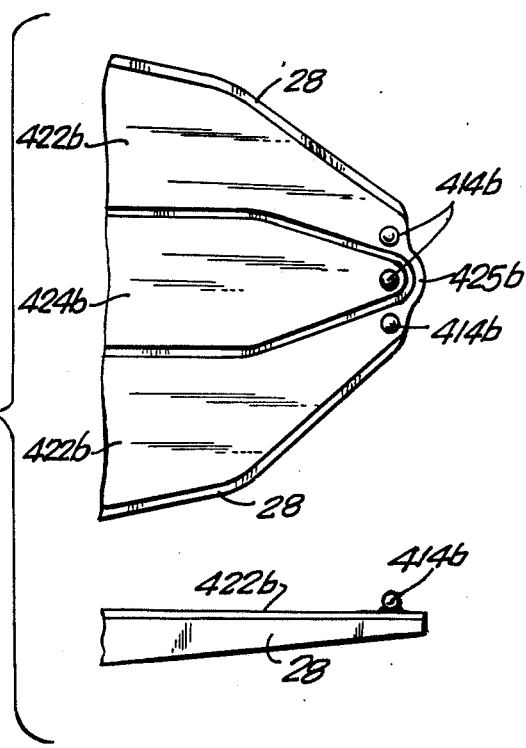
FIG. 4(b) illustrates contacts made by metallic miniballs soldered on the center strip and ground planes of the probe.

In FIG. 4(b) ground planes 422b and strip line 424b all have contact points 414b disposed on their surfaces. The ground planes 422b and the strip line 424b are disposed on substrate 28. These contact points 414b are oval in shape. A metallic link 425b connects the ground planes 422b.

FIGS. 4(a) and 4(b) also show the details of the contact region. The gap in the contact region may be different from that in the co-planar line region. The shape and the dimensions of the gap should be optimized to achieve impedance matching and minimize the parasitics.

FIGS. 4(a) and 4(b) are only two examples of contact designs. It is not necessary to be limited to these particular configurations. The probe may be identical to that shown in FIG. 4(a) or FIG. 4(b) with the exception of the metallic link. As stated above, a probe may be configured without such a link if odd modes are not a concern. The co-planar lines and the contact points in the present invention are produced from materials having a high conductivity as well as high durability. One possible material for these co-planar lines is gold. Gold can also be used to produce the contacts disposed upon the co-planar lines. The gold has a high level of conductivity and also has a high level of durability so that the probe may be used time and time again. Another possibility for the co-planar line and the contact point is to use superconductors. This would further increase the operational speed of the probe due to the enhanced conductivity of the probe. It should be understood that the material used for the co-planar lines is not limited to gold or superconductors. Instead, the co-planar lines and contacts may be of any material that is high in electrical conductivity and has high durability.

Figure 5A:
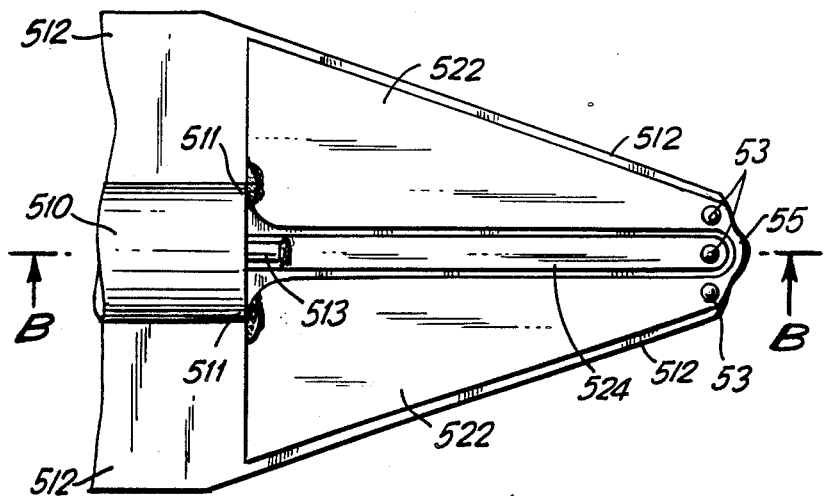

FIG. 5(a) illustrates the interface of the miniaturized coaxial cable to an embodiment of the probe of the present invention with more specifics. A miniaturized coaxial cable 510 interfaces a coplanar line produced by ground planes 522 and strip line 524. The ground planes are connected by metallic link 55. The coaxial cable has ground conductor 511 and center conductor 513. The center conductor 513 is soldered to the strip line 524 while the ground conductor 511 is soldered to the ground planes 522. The coplanar line is disposed on the substrate 512 and has contacts 514. The contacts are solder balls that are illustrated as elements 53 of FIG. 5(a).

Figure 5B:
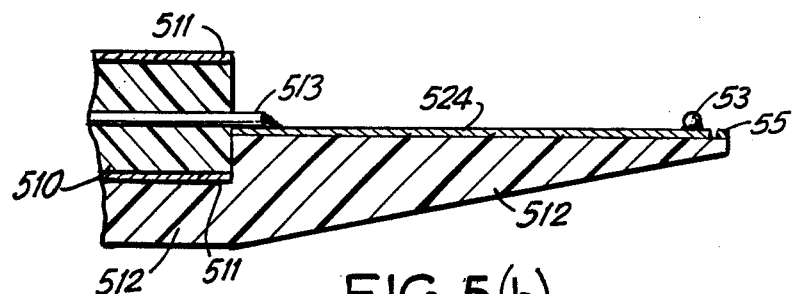
FIG. 5(b) illustrates a cross sectional view of the probe of FIG. 5(a)

FIG. 5(b) illustrates a cross-sectional view of the probe of FIG. 5(a).

Figure 5C:
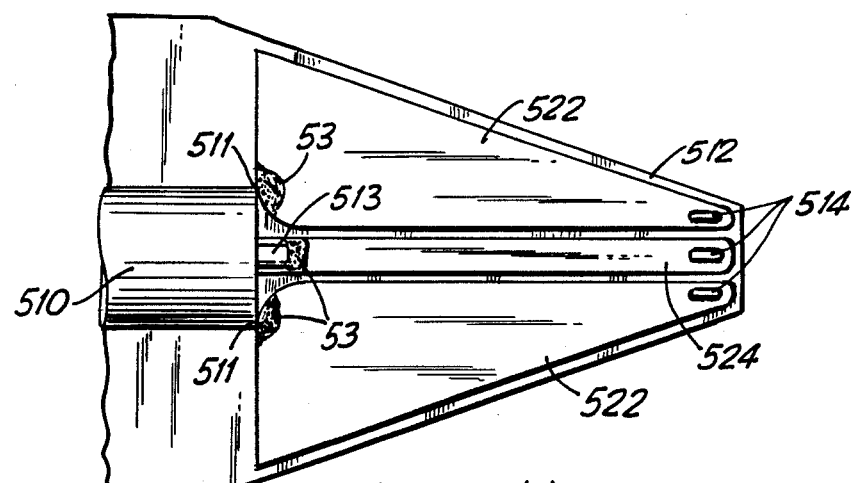
FIG. 5(c) illustrates an "A" view of the connection of elements in another embodiment of the probe of the present invention.

FIG. 5(c) illustrates the interface of the miniaturized cable to an embodiment of the probe of the present invention with more specifics. This probe is identical to that of FIGS. 5(a) and 5(b) except that there is no metallic link 55. A coaxial cable 510 interfaces a co-planar line produced by ground planes 522 and strip line 524. The coaxial cable has ground conductor 511 and center conductor 513. The center conductor is soldered to the strip line 524 while the ground conductor is soldered to the ground planes 522. The co-planar line is disposed on the substrate 512 and has contacts 514. The solder balls are illustrated as elements 53 of FIG. 5(c).

The co-planar line and its connection to the cable are arranged to be at nearly a zero degree angle with respect to the plane of the on-wafer circuit when the probe is in contact with the circuit. Therefore, discontinuities are reduced. Reflections and high mode excitations are also reduced. As a result the operational capabilities of the probe are enhanced. The unique probe configuration of the present invention minimizes the influence of the probe in slowing down the speed of the circuitry to which the circuit on the wafer is to be attached. The flexibility and dielectric characteristics of the substrate permit a substrate of a reduced length which thereby allows for a co-planar line of a reduced length. The result is a reduction in the introduction of lossy characteristics and cross talk into the system. The performance degraders are normally the result of using co-planar lines of greater length.

Compared to the probe approach disclosed in U.S. Pat. No. 4,697,143, the probe of the present invention has a much smaller substrate with a strip and ground planes disposed thereon. One of the advantages of the probe of the present invention is that the undesirable parasitic coupling between the probe and the circuit on wafer is minimized. Therefore, there is no need for additional shielding and no need for absorbing materials which are used extensively in the probe described in the 4,697,143 patent.

Based on the principles and techniques developed for the probe of the present invention, a variety of embodiments can be developed to enhance its performance.

Figure 6:
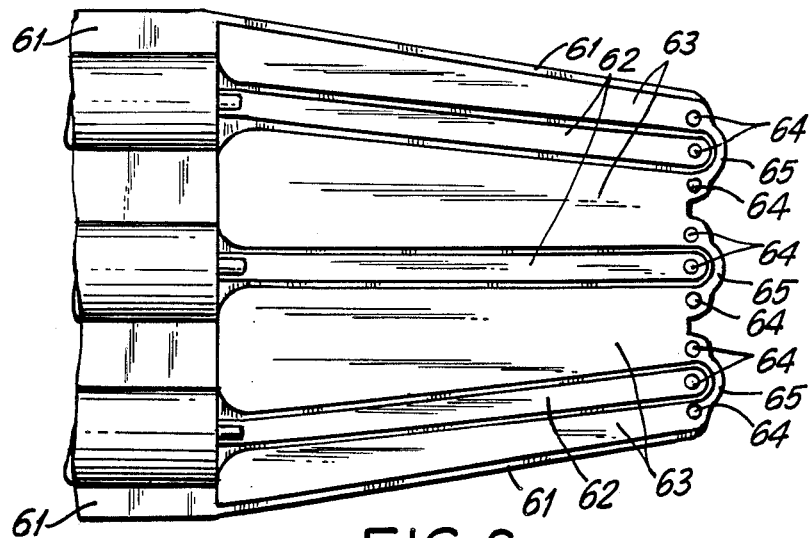
FIG. 6 illustrates the details of a multi-channel probe in accordance with an embodiment of a probe of the present invention.

FIG. 6 shows a multi-channel probe on which a plurality of transmission lines are disposed on a common substrate 61. The transmission lines are coplanar lines with alternate center strip line 62 and ground planes 63. On the tip of the probe, contacts 64 are sitting on top of center strip line 62 or ground planes 63. In order to achieve a secure connection to the circuit on wafer, the substrate is cut into corrugated shape as illustrated. In this way, the contacts on each transmission line have more flexibility i.e., flexibility beyond that provided by the softness of the substrate. The gaps between adjacent central strips and the ground planes should be kept to a predetermined distance to maintain a prescribed impedance such as 50 ohms. Each ground plane 63 between two strip lines 62 has two contacts 64, one for use with each channel. Also, a metallic bridge 65 is used to connect the ground planes for each channel. Alternatively, a multichannel probe can have an identical configuration with the exception of a metallic bridge.

Figures 7, 8:
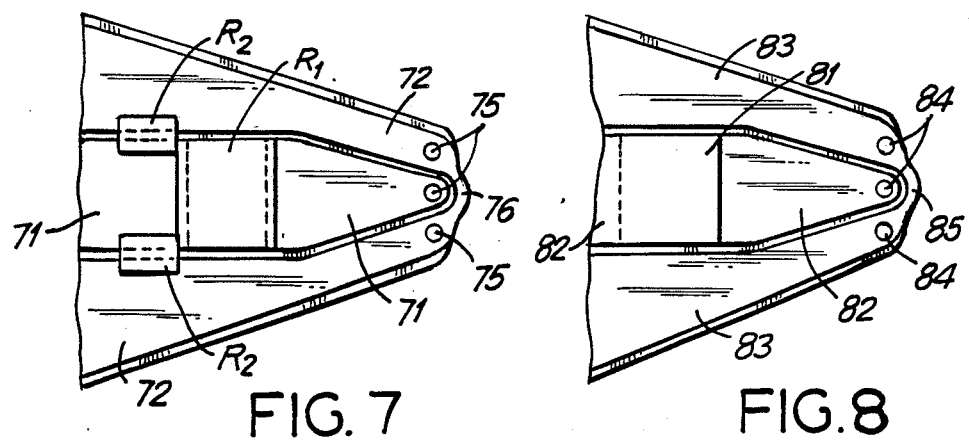
FIG. 7 illustrates another embodiment of a probe of this invention with a built-in printed circuit resistor network to provide a high impedance buffer.
FIG. 8 illustrates another embodiment of a probe of this invention with built-in printed circuit capacitors to provide a DC block.

Sometimes, a probe is needed to test the circuit on a wafer, not at its input or output, but at any point in the circuit. The problem with the regular low impedance probe, which is typically a 50-ohm probe, used for this purpose is that the connection of the probe provides an additional load to the circuit at the test point. In order to avoid this unwanted disturbance, a high impedance buffer built-in to the probe is needed. FIG. 7 illustrates such a probe based on the technique developed in accordance with a further embodiment of the present invention. A series resistance $R_1$ is inserted into the center strip 71 at its tip just before the contact 75. Two shunt resistances with the same value $R_2$ are placed between the center strip 71 and the two ground planes 72. For this arrangement, the impedance looking from the tip into the probe is $$Z_2 = R_1 + \frac{R_2 Z_c}{R_2 + 2Z_c}$$

Here $Z_c$ is the characteristic impedance of the coplanar line. When the probe is connected to a circuit with input impedance $Z_{in}$, the impedance looking from the transmission into the buffer is $$Z_1 = \frac{R_2(R_1 + Z_{in})}{R_2 + 2R_1 + 2Z_{in}}$$

According to these two formulas, if $R_1 >> Z_c$, $R_1 >> R_2$ and $Z_{in} \approx Z_c$, $Z_2$ should be much higher than $Z_c$. At the same time, $Z_1$ should be close to $Z_c$. In this way, the shunt effect on the circuit under test should be minor.

FIG. 8 shows a probe with DC block built-in. A capacitor 81 is inserted into the center strip 82. The value of the capacitance is sufficient to allow the lowest frequency in band to go through, but it blocks the DC component in the signal. This probe is useful for testing active devices such as amplifiers in which the DC and RF channels must be separated.

Also, based upon the principles and techniques developed for the probe of the present invention, a variety of embodiments of the probe and a variety of systems utilizing the probe can be developed whereby the probe connects the circuit on the chip to other electrical equipment. One such piece of electrical equipment can be a test system or test apparatus for testing the operating characteristics of the circuit on the wafer. While the remainder of the description of the probe will be with reference to its application in a system connecting a test circuit to the circuit on the wafer, it is to be remembered that the use of the probe is not limited to such a configuration. The probe can be used in any system in which a circuit on a wafer must be connected to an external system.

Figure 13A:
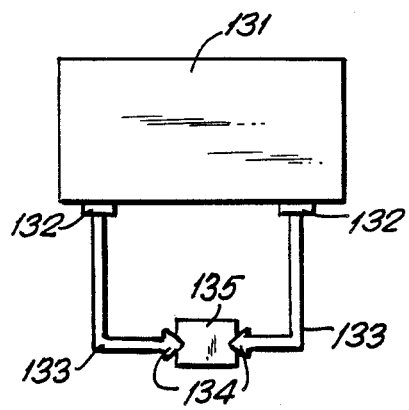
FIGS. 13(a) to 13(d) illustrate a variety of multi-probes-on-a-wafer configurations utilizing probes of the present invention.

FIGS. 13(a) to 13(d) illustrate independent multi-probe arrangements for providing connection to circuits on a chip. Test instrument 131 has interfaces 132. In FIG. 13(a) two transmission line links 133 are provided to two different probes 134. For purposes of discussion of this figure it is assumed that each probe is an independent, single channel probe. Taking one of the probes 134, it is capable of transmitting a signal to a circuit on chip 135. The signal is to be detected by the second probe 134 and transmitted back to the test equipment 131 for processing. An alternative operation is that each probe tests circuits on the chip independently so that each probe will transmit a signal into a circuit on the wafer and will itself detect a response to that signal. The test equipment 131 then processes both responses to evaluate the operations of the circuitry on wafer 135.

Figure 13B:
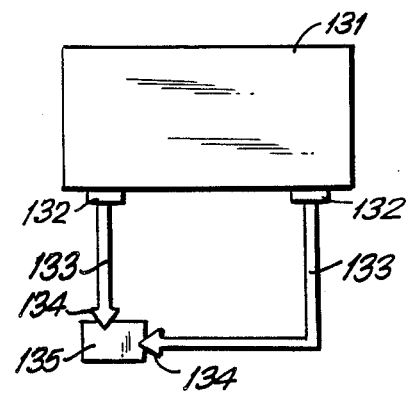
Figure 13C:
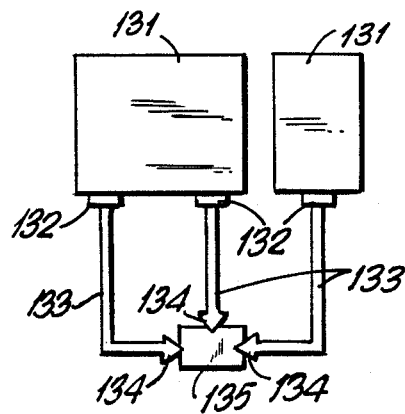
Figure 13D:
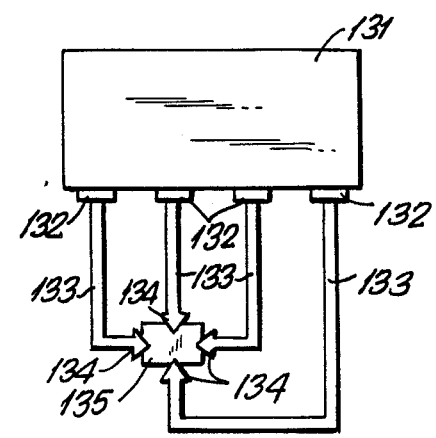

FIG. 13(a) illustrates a dual-channel system with independent probes aligned at an angle of 180°. FIG. 13(b) illustrates a dual channel system with independent single channel probes aligned at a 90° angle. FIG. 13(c) illustrates a system in which three single channel probes 134 are connected to wafer 135 at 180° and 90°, while FIG. 13(d) illustrates a four single-channel probe arrangement at 90° and 180°.

It should be noted that the above described angular relationships are provided for purposes of example and are not to be considered exhaustive of the relationship possibilities.

Expanding upon the capabilities of the probe, a probe of the present invention may be used as a multi-channel probe as illustrated in FIG. 6. This means that there may be a plurality of channels interfacing a circuit on a wafer through just one probe. Possible configurations for multi-channel probes are illustrated in FIGS. 14(a) to 14(d). In these figures, test equipment 141 has interfaces 142 and these interfaces are connected through transmission lines 143 to probes 144 which are in contact with a circuit on wafer 145.

Figure 14A:
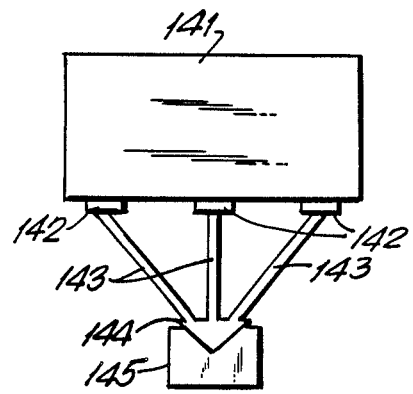
FIGS. 14(a) to 14(d) illustrate a variety of configurations of multiple channels on a single probe with the probe being connected to a wafer, utilizing probes of the present invention.

In FIG. 14(a), three channels through three separate interfaces 142 are connected by transmission lines 143 to a single probe 144 which is connected to the wafer 145.

Figure 14B:
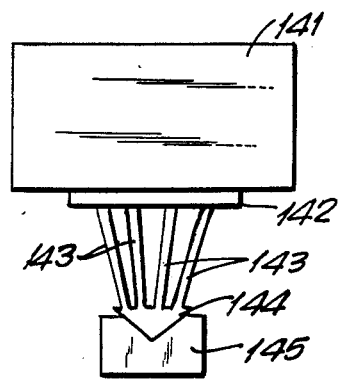

In FIG. 14(b), a plurality of transmission lines 143 are connected to a single interface 142. All of the lines 143 are connected to a single probe 144. The single probe 114 is connected to wafer 145.

Figure 14C:
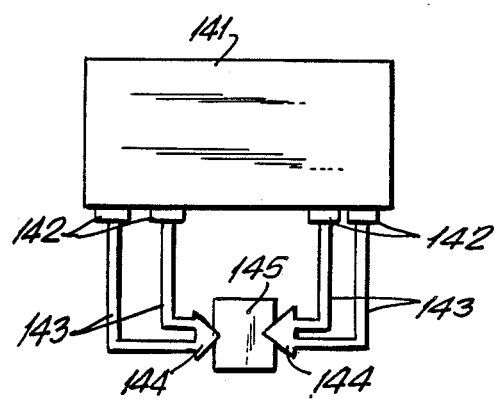

In FIG. 14(c), two probes are placed in contact with the wafer 145 A single test unit 141 has a plurality of interfaces 142, each interface having a single transmission line 143 attaching the interface to a specific probe 144. There are two transmission lines 143 attached to each probe 144. The probes are arranged in a 180° relationship in a manner similar to the probes of FIG. 13(a), however in FIG. 14(c), each probe has at least two channels connected to it.

Figure 14D:
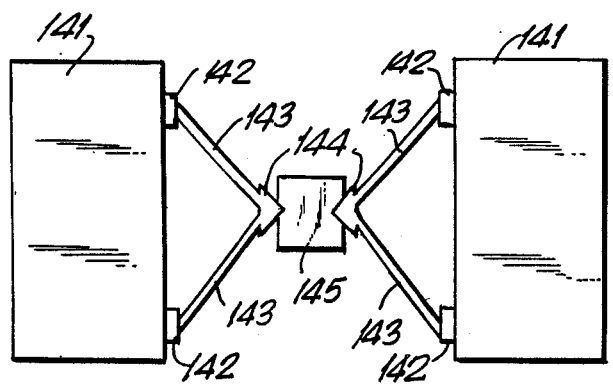

Finally, FIG. 14(d) illustrates the use of two separate test units 141, each with a plurality of interfaces 142. Each interface has a transmission line associated with it which connects the interface to one of the two probes 144. Therefore each test unit 141 has a plurality of transmission lines or channels connected to a single probe with the two probes of the system being arranged in a 180° relationship. The angular relationship between the probes is not restricted to 180°, bu rather has the same angular flexibility as described above with respect to the multi-probe arrangements of FIGS. 13(a) to 13(d).

Figure 9:
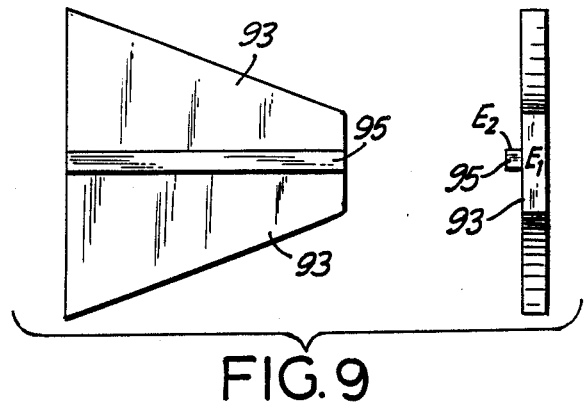
FIG. 9 illustrates a single channel probe having a dielectric waveguide in accordance with another embodiment of the probe of the present invention.

FIG. 9 illustrates a single channel configuration utilizing a dielectric waveguide as a transmission means. The dielectric waveguide 95 is disposed upon a substrate 93. The dielectric constant $E_2$ of the waveguide 95 is selected to be greater than the dielectric constant $E_1$ of the substrate 93. It should be noted that the probes illustrated in FIGS. 2(a) and 2(b), FIGS. 3(a) to 3(e), FIGS. 4(a) and 4(b) and FIGS. 5(a) to 5(c) are all single channel probes. FIG. 9 is different in that a dielectric waveguide 95 is utilized for transmitting signals between the circuit on the wafer and the electrical system to which the probe is attached.

As described above, the probe of the present invention has enhanced sophistication capabilities. In the present invention an additional integrated circuit may be integrated directly on the probe to the portion of the probe which establishes the connection between the circuit on the wafer and the electrical system to which the probe is connected. FIGS. 10(a) to 10(e) illustrate different embodiments for the probe of the present invention wherein different integrated circuits are utilized on the probes.

Figure 10A:
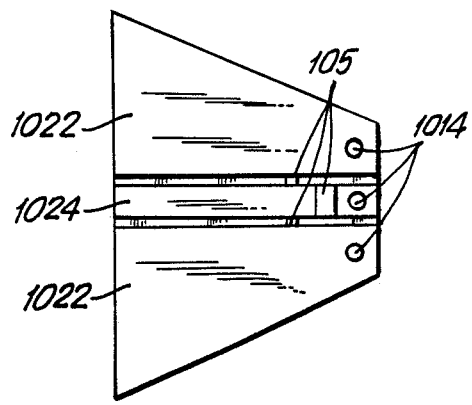
FIGS. 10(a) to 10(e) illustrate embodiments of the probe of the present invention utilizing different integrated circuits on each of the embodiments of the probes.
Figure 10B:
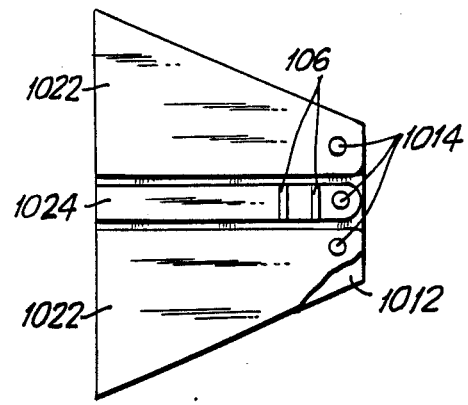

FIGS. 10(a) and 10(b) correspond to the configurations of FIGS. 7 and 8. However, in the configurations of 10(a) and 10(b) there is no metallic strip 76 or 85 connecting the ground planes in order to inhibit odd moving as set forth in FIGS. 7 and 8 respectively.

In FIG. 10(a) two ground planes 1022 and a strip line 1024 are provided. Additionally, there are contact points 1014 for the ground planes 1022 and the strip line 1024. Attached to the probe are resistances 105. This impedance can be a high impedance which would produce a high impedance probe capable of being used for intermediate contact along a circuit on a wafer with a very slight disturbance on the circuit of the wafer to which the probe is connected rather than connecting to an end point. The resistor used as the impedance can be a thin film resistor given the thin film structure of the co-planar line produced by the ground planes 1022 and strip line 1024. The thin film resistor size must therefore be minimized in order to eliminate parasitic characteristics. The distance between the resistances and the distance between resistances and the contacts should be minimized for the same purpose.

FIG. 10(b) illustrates a probe which utilizes capacitance 106 to form a DC block or an AC coupling for a probe. This represents another possible integrated circuit which can be included with the probe of the present invention to enhance its sophistication. The capacitance 106 is disposed across strip line 1024. The probe also includes ground planes 1022. The co-planar line, composed of the ground planes and the strip line, is disposed on the substrate 1012. The ground planes and the strip line have contacts 1014.

Figure 10C:
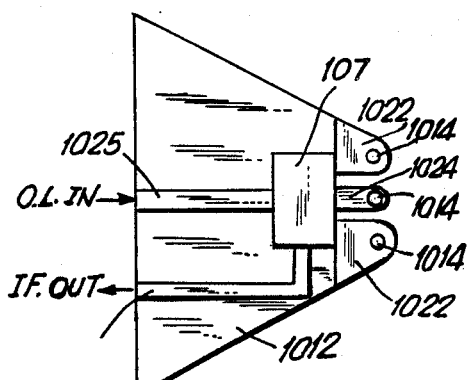

FIG. 10(c) illustrates a probe which has an integrated circuit that is a mixer circuit. In this configuration the co-planar line comprising ground planes 1022 and strip line 1024 are oriented at a tip of the probe. The ground planes 1022 and the strip line 1024 have contacts 1014. A mixer 107 is disposed on substrate 1012 and connected to the co-planar line. Additional strip lines 1025 provide connections from external circuitry to the mixer 107.

Figure 10D:
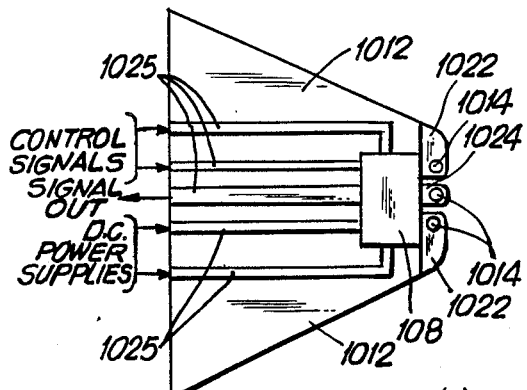

FIG. 10(d) illustrates yet another integrated circuit-on probe configuration. A front end of an electrical circuit or device 108 is disposed in substrate 1012. The front end of the electrical circuit or device 108 is connected to a co-planar line which consists of ground planes 1022 and strip line 1024. Contacts 1014 are provided for each of the elements of the co-planar line. Additional strip lines 1025 are provided on the substrate so as to provide connections between the front end of electrical circuit or device 108 and external circuitry to which the probe may be connected. The configuration of the co-planar line is similar to that of the probe illustrated in FIG. 10(c).

Figure 10E:
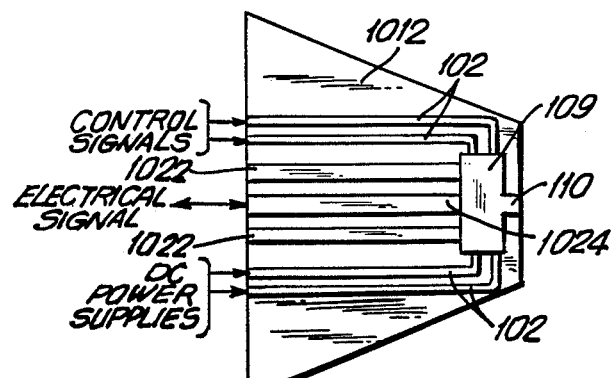

FIG. 10(e) illustrates yet another example of a probe having enhanced sophistication due to an integrated circuit disposed on the probe. In this configuration ground planes 1022 and strip lines 1024 are disposed on substrate 1012 and are connected to an electro-optical converter 109. The electro-optical converter is connected to an optical waveguide 110 which provides an optical interface for the probe end. Therefore, in this configuration electrical and optical signals can be utilized by the probe in its connection to the circuit on the wafer. This greatly enhances the sophistication of the probe.

The above printed circuits are merely intended to be exemplary of the sophistication which can be added to the probe of the present invention due to its unique configuration. The printed circuits may consist of any other passive or active networks that would enhance the operational capabilities of the device.

Throughout the specification to this point we have discussed the transmission of signals through the probe and between a circuit on a wafer and some external electrical circuit. It is important to realize that the type of transmission line utilized for transmitting signals between the external electrical circuit and the circuit on the wafer can be constituted by any type of transmission line. FIGS. 11(a) to 11(f) are representative of the types of transmission lines which may be utilized as the co-planar lines on the end of the test probe, as the cable 10 which connects the co-planar lines to the interconnector illustrated in FIG. 1 or as the coaxial connector 19 of FIG. 1.

Those figures bearing "I" are side views of types of transmission lines while those figures having corresponding figure numbers and bearing "II" are corresponding cross-sectional views of the transmission lines of which there is a side view.

FIGS. 11(a) I & II illustrate a co-axial transmission line having center conductor 113 and outer conductor 116.

FIGS. 11(b) I & II illustrate a co-planar line configuration in which areas 11 constitute ground planes while area 112 is a strip line. Area 114 is a substrate of the probe.

FIGS. 11(c) I & II illustrate a strip line 112 disposed on a substrate 114 with a ground plane 111 being disposed on a bottom portion of the substrate. This is a microstrip configuration.

FIGS. 11(d) I & II illustrate a center strip line configuration whereby ground planes 111 are disposed on the top and bottom surfaces of substrate 114 while a strip line is disposed through the center of substrate 114.

FIGS. 11(e) I & II illustrate a parallel line configuration for a transmission line. Strip lines 112 are disposed in a parallel fashion on substrate 114.

FIGS. 11(f) I & II illustrate a dielectric waveguide transmission line whereby a dielectric waveguide 115 is disposed on substrate 114.

All of these transmission line configurations can be used in any of the three places in the probe illustrated in FIG. 1 through which signals are carried, i.e., from the contact points 14 to the cable 10 or as cable 10 or as coaxial connector 19. Regardless of the types of transmission lines used, interfaces between transmission lines should be optimized in order to eliminate reflections, radiations or high mode excitation. In the case of a multi-channel link, the cross talk between adjacent lines should be avoided by means of large separation or shielding. In the case of conducting transmission lines, superconducting material can be used in order to reduce the insertion loss and the dispersion. When using superconducting material certain cryogenic systems may be required in order to maintain the low temperatures required for superconductivity.

FIGS. 12(a) to 12(d) illustrate a plurality of contact configurations which provide additional flexibility and assure better contact for the probe in its connection with the on-wafer circuit.

FIG. 12(a) illustrates a finger-type flexible contact tip whereby a plurality of independent contacts are provided on the substrate, each with their own independent flexibility and freedom of movement so that the contacts can adapt to variations in the surface of the wafer upon which the probe is to be placed. A plurality of strip lines 122 are disposed on substrate 124. Each of the strip lines is provided with contact points 123. A finger type configuration means that each contact is motion independent from the other contacts with the flexibility to adapt to a non-uniform surface on the wafer.

FIG. 12(b) illustrates an elastic metal contact whereby a minispring 123 is produced on the substrate 124. The spring has an elastic nature and provides sufficient contact when the probe is placed in connection with the on-wafer circuit.

FIG. 12(c) illustrates a cantilever contact whereby the contact 123 is disposed on the strip line 128. This line is disposed on an insulating layer which may be composed of $SiO_2$ or a like material with a gap between a portion of the insulating layer and the base substrate 129 which may be composed of silicon or a like material. This configuration also provides the contact with flexibility in its connection with the circuit on the chip so as to provide a more complete connection to the circuit.

FIG. 12(d) illustrates a self-aligned dielectric waveguide probe whereby the dielectric waveguides, 125 of the probe are embedded in the substrate 124 and the waveguides have dielectric constant $E_1$ which is greater than the dielectric constant $E_2$ of the substrate. The circuit on the wafer has dielectric waveguides 125 as well, which protrude from the surface of the wafer. The shapes of the indentations of the probe containing the dielectric waveguides 125 of the probe are shaped so as to correspond to the protruding dielectric waveguides 125 of the wafer so as to enable the probe to properly self align with the circuit on the wafer.

FIG. 12(e) illustrates a self aligning probe that has a single channel co-planar transmission line configuration. Contacts 123 are disposed on the co-planar line 122 of the probe 120. The contacts are also disposed in spaces in a substrate 124. Contacts 123 are also disposed as protrusions in the chip so that the contacts will connect when the probe is properly aligned in the chip and this process is a self-alignment process.

FIG. 12(f) illustrates a multi-channel self-aligning probe 120 having contacts 123 on the co-planar line of channels 122. The construction is similar to that illustrated in 12(e) only expanded to accommodate multiple channels.

The present invention provides a unique configuration for a probe that provides a connection between a circuit on a wafer and an electrical system which may comprise elements such as a testing device. The configuration of the probe reduces the probe's influence upon the overall system created by the connection of the circuit on the wafer to the external electric circuit. The present invention reduces the likelihood of the reflection of signals by the probe and reduces the likelihood of the creation of high excitation modes. The present invention also reduces the negative effect that the probe has on the overall speed of the operation of the system and it reduces the loss and cross talk which may be introduced by a probe into the overall system. The present invention also inhibits excitation of odd modes which might otherwise result from such conditions as an asymmetric probe configuration.

The instant probe also provides the flexibility to introduce further sophistication by means of adding integrated circuits to the probe itself. The present invention also provides flexibility for creating multi-channel, multi-probe configurations to be in contact with circuits on wafers. In addition, the present invention provides unique contact configurations which further enhance the connection characteristics of the probe.

The present invention provides a novel probe for connecting a circuit on a wafer to an external circuit with minimal impact by the probe itself upon the circuit.

What is claimed is:

1. A soft miniaturized probe for providing a connection to an on-wafer circuit comprising:
    a soft flexible substrate;
    a center strip line disposed on a first surface of said substrate;
    first and second ground planes, each disposed on said first surface of said substrate, one ground plane disposed on either side of said center strip line;

a plurality of contacts, one contact disposed on said center strip line and one contact disposed on said first ground plane, said contacts providing a conductive path between said on-wafer circuit and said strip line and between said on wafer circuit and said first ground plane; and a metallic bridge disposed on said first surface of said soft flexible substrate in close proximity to said plurality of contacts electrically connecting said first and second ground planes which are disposed on either side of said center strip line.

2. The soft wafer probe of claim 1, further comprising a passive electrical circuit disposed on a second surface of said soft flexible substrate and connected to said center strip line.

3. The soft wafer probe of claim 1, further comprising an active electrical circuit disposed on a second surface of said soft flexible substrate and connected to said center strip line.

4. The soft wafer probe of claim 1 wherein each of said plurality of contacts has its own independent flexibility and freedom of movement to adapt to variations in the surface of a wafer.

5. The soft wafer probe of claim 1 wherein each of said plurality of contacts is a cantilever contact.

6. The soft wafer probe of claim 1, further comprising a plurality of transmission strip lines disposed on said soft flexible substrate together with a plurality of ground planes said plurality of transmission lines and said plurality of ground planes being disposed in a one-by-one alternating arrangement.

7. The soft wafer probe of claim 6 wherein ground planes on either side of a transmission strip line are connected by a metallic bridge disposed on the first surface of said soft flexible substrate.

* * * * *

UNITED STATES PATENT AND TRADEMARK OFFICE
CERTIFICATE OF CORRECTION

PATENT NO. : 4,894,612
DATED : 16 January 1990
INVENTOR(S) : Robert E. DRAKE et al.

It is certified that error appears in the above-identified patent and that said Letters Patent is hereby corrected as shown below:

| Column | Line | |
|---|---|---|
| ABSTR. | 7 | Change "result" to --results--. |
| 2 | 11 | Change "Cascad" to --Cascade--. |
| 3 | 13 | Change "simple" to --Simple--. |
| 3 | 27 | Change "versatility" to --Versatility--. |
| 5 | 1 | Change "details." to --detail--. |
| 5 | 47-48 | Change "illustrates" to --illustrate--. |
| 6 | 11 | Change "vessel" to --vespel--. |
| 8 | 44 | Delete the comma after "FIG.". |
| 11 | 31 | After "Into" insert --a--. |
| 13 | 27 | Change "bu" to --but--. |
| 13 | 56 | Change "moving" to --moding--. |

UNITED STATES PATENT AND TRADEMARK OFFICE
CERTIFICATE OF CORRECTION

PATENT NO. : 4,894,612

DATED : 16 January 1990

INVENTOR(S) : Robert E. DRAKE et al.

It is certified that error appears in the above-identified patent and that said Letters Patent is hereby corrected as shown below:

| Column | Line | |
|--------|------|---|
| 14 | 18 | Change "line" to --lines--. |
| 15 | 10 | Change "areas 11" to --areas 111--. |

Signed and Sealed this

Fifth Day of March, 1991

Attest:

HARRY F. MANBECK, JR.

Attesting Officer

Commissioner of Patents and Trademarks